United States Patent
Van Bommel et al.

(10) Patent No.: US 10,451,793 B2
(45) Date of Patent: Oct. 22, 2019

(54) LIGHTING DEVICE HAVING PLURAL LIGHT-SOURCES AND LIGHT GUIDE WITH WAVELENGTH CONVERTING MEANS AND OUT COUPLING MEANS

(71) Applicant: SIGNIFY HOLDING B.V., Eindhoven (NL)

(72) Inventors: Ties Van Bommel, Eindhoven (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 133 days.

(21) Appl. No.: 15/039,752

(22) PCT Filed: Dec. 9, 2014

(86) PCT No.: PCT/EP2014/076954
§ 371 (c)(1),
(2) Date: May 26, 2016

(87) PCT Pub. No.: WO2015/091081
PCT Pub. Date: Jun. 25, 2015

(65) Prior Publication Data
US 2017/0023730 A1  Jan. 26, 2017

(30) Foreign Application Priority Data

Dec. 20, 2013  (EP) .................................. 13199210

(51) Int. Cl.
*F21V 8/00* (2006.01)
*H01L 25/075* (2006.01)
(Continued)

(52) U.S. Cl.
CPC ......... *G02B 6/0076* (2013.01); *G02B 6/0003* (2013.01); *G02B 6/0016* (2013.01);
(Continued)

(58) Field of Classification Search
CPC .. G02B 6/0053; G02B 6/0036; G02B 6/0031; G02B 6/0028; G02B 6/0038;
(Continued)

(56) References Cited

U.S. PATENT DOCUMENTS 7,703,973 B2 * 4/2010 Zhu ...................... G02B 6/0018
362/297
8,251,562 B2 * 8/2012 Kuramitsu ........... G02B 6/0021
349/65
(Continued)

FOREIGN PATENT DOCUMENTS

EP  2629341 A1  8/2013
FR  2964722 A1  3/2012
(Continued)

OTHER PUBLICATIONS

V.Y.F. Leung, et al., "Interplay Between Multiple Scattering, Emission, and Absorption of Light in the Phosphor of a White Light-Emitting Diode", Optical Society of America, Apr. 7, 2014, vol. 22, No. 7, pp. 15 pages total.

Primary Examiner — Robert J May
(74) Attorney, Agent, or Firm — Akarsh P. Belagodu (57) ABSTRACT

A light emitting device (1) comprising a plurality of first light sources (21, 22, 23, 24, 25, 26, 27, 28) adapted for, in operation, emitting first light (13) with a first spectral distribution, and a first light guide (3) comprising a first light input surface (31, the first light guide being adapted for receiving the first light with the first spectral distribution at the first light input surface, converting at least a part of the first light with the first spectral distribution to second light (14) with a second spectral distribution, and guiding the second light to the first light input surface, the light emitting device further comprising one first light out-coupling element (9, 91, 92) for coupling light out of the first light input surface, the first light out-coupling element being arranged in or on the first light input surface at a pre-selected location on a plane in which the first light input surface extends.

14 Claims, 7 Drawing Sheets

(51) Int. Cl.
*H01L 33/50* (2010.01)
*H01L 33/58* (2010.01)

(52) U.S. Cl.
CPC ......... *G02B 6/0035* (2013.01); *G02B 6/0055* (2013.01); *G02B 6/0068* (2013.01); *G02B 6/0085* (2013.01); *H01L 25/0753* (2013.01); *G02B 6/0063* (2013.01); *G02B 6/0073* (2013.01); *H01L 33/504* (2013.01); *H01L 33/505* (2013.01); *H01L 33/58* (2013.01); *H01L 2924/0002* (2013.01)

(58) Field of Classification Search
CPC .. G02B 6/0068; G02B 6/0055; G02B 6/0061; G02B 6/0016; G02B 6/002; G02B 6/0003; G02B 6/005; G02B 6/0033
USPC .................. 362/606, 607, 610, 613, 621
See application file for complete search history.

(56) References Cited

U.S. PATENT DOCUMENTS

| | | | | |
|---|---|---|---|---|
| 8,506,106 | B2 * | 8/2013 | Kim | .................. G02B 6/0031 |
| | | | | 362/610 |
| 8,575,641 | B2 | 11/2013 | Zimmerman et al. | |
| 8,727,592 | B2 * | 5/2014 | Ishizaka | ............... G02B 6/0088 |
| | | | | 362/606 |
| 8,797,480 | B2 * | 8/2014 | Goto | .................... G02B 6/0038 |
| | | | | 349/62 |
| 9,052,423 | B2 * | 6/2015 | Hikmet | ...................... G02B 6/0003 |
| 9,127,818 | B2 * | 9/2015 | Maxik | ...................... F21K 9/175 |
| 9,618,687 | B2 * | 4/2017 | Ohkawa | ............... G02B 6/0068 |
| 2006/0227570 | A1 | 10/2006 | Rutherford et al. | |
| 2009/0217970 | A1 | 9/2009 | Zimmerman et al. | |
| 2009/0296368 | A1 | 12/2009 | Ramer | |
| 2012/0140436 | A1 | 6/2012 | Yang et al. | |

FOREIGN PATENT DOCUMENTS

| | | | | |
|---|---|---|---|---|
| JP | 200471357 A | 3/2004 | | |
| JP | 2004273203 A | 9/2004 | | |
| WO | WO2009115998 A2 | 9/2009 | | |
| WO | WO-2012056382 A1 * | 5/2012 | ........... G02B 6/0003 |
| WO | WO2012056382 A1 | 5/2012 | | |
| WO | WO2013005151 A1 | 1/2013 | | |
| WO | WO2013136899 A1 | 9/2013 | | |

* cited by examiner

LIGHTING DEVICE HAVING PLURAL LIGHT-SOURCES AND LIGHT GUIDE WITH WAVELENGTH CONVERTING MEANS AND OUT COUPLING MEANS

CROSS-REFERENCE TO PRIOR APPLICATIONS

This application is the U.S. National Phase application under 35 U.S.C. § 371 of International Application No. PCT/EP2014/076954, filed on Dec. 9, 2014, which claims the benefit of European Patent Application No. 13199210.9, filed on Dec. 20, 2013. These applications are hereby incorporated by reference herein.

FIELD OF THE INVENTION

The invention relates to a light emitting device having a plurality of light sources and a light guide. The invention further relates to a lamp, a luminaire or a lighting system comprising such a light emitting device.

BACKGROUND OF THE INVENTION

High intensity light sources, and particularly white high intensity light sources, are interesting for various applications including spots, stage-lighting, automotive lighting and digital light projection. For such purposes, it is possible to make use of so-called light concentrators where short wavelength light is converted to longer wavelengths in a highly transparent luminescent material. Such a transparent luminescent material is illuminated by LEDs to produce longer wavelengths within the luminescent material. Converted light, which will be waveguided in the luminescent material, is extracted from a surface leading to an intensity gain and thus brightness gain.

Document WO 2012/056382 A1 describes in one embodiment a lighting device for such a purpose and comprising a waveguide, one light source and a plurality of light outcoupling means. The waveguide may be provided with a luminescent material arranged on or in the waveguide and may thereby be configured to convert light from a light source into luminescent material emission.

The light output can then be increased by coupling in more light, by making the light guide longer and increase the number of LEDs that is used to illuminate the luminescent concentrator. However, as a result of self-absorption in the luminescent material as well as increased light outcoupling due to the LEDs, the larger, and particularly the longer, the light guide is, the more light will be lost, which in turn leads to a decrease in the intensity gain of the light emitted by the light guide and thus the light emitting device. Thus, the scalability of the light emitting device is radically decreased.

SUMMARY OF THE INVENTION

It is an object of the present invention to overcome this problem, and to provide a light emitting device with which light propagating in different directions in the light emitting device may be combined such as to obtain an improved scalability and with which a high intensity output may be obtained and light losses lowered or even eliminated also for light emitting devices comprising relatively large and/or long light guides.

According to a first aspect of the invention, this and other objects are achieved by means of light emitting device comprising a plurality of first light sources adapted for, in operation, emitting first light with a first spectral distribution, and a first light guide comprising a first light input surface, the first light guide being adapted for receiving the first light with the first spectral distribution at the first light input surface, converting at least a part of the first light with the first spectral distribution to second light with a second spectral distribution, and guiding the second light to the first light input surface, the light emitting device further comprising a first light out-coupling element for coupling light out of the first light input surface, the first light out-coupling element being arranged in or on the first light input surface at a pre-selected location on a plane in which the first light input surface extends.

By providing a plurality of first light sources the intensity and thus the brightness of the light output may be improved considerably.

By providing a first light out-coupling element for coupling light out of the first light input surface, and particularly by arranging the first light out-coupling element in or on the first light input surface at a pre-selected location on a plane in which the first light input surface extends, light propagating in different directions in the light guide, particularly light originating from each of the plurality of light sources, may be combined as all or most light coupled out of the light guide is coupled out via the light out-coupling element. Furthermore, the exact position of the out-coupling of light from the light guide may in this way be chosen according to the requirements in a given application, e.g. such as to couple light out in a desired direction and/or to provide a desired spot size of the light coupled out of the light emitting device. Thereby a light emitting device having a considerably improved scalability is provided.

By providing a light guide being adapted for converting at least a part of the in-coupled light to converted light with a different spectral distribution, a light guide is provided with which a particularly large amount of the converted light will remain in the light guide and can be extracted from one of the surfaces, which in turn leads to a particularly high intensity gain. This also contributes to improving the scalability of the light emitting device.

By providing the light out-coupling element at or on the same surface as where light is coupled in from the light sources, a particular compact light emitting device is obtained.

In an embodiment the first light out-coupling element is arranged in or on the first light input surface at the center of a plane in which the first light input surface extends.

In an embodiment the first light input surface comprises a circumferential edge, and the first light out-coupling element is arranged at a location on the first light input surface, which location is at a position where any distance perpendicular to the circumferential edge is the largest possible, all distances perpendicular to the circumferential edge being given equal weight.

By any of the two above mentioned embodiments a light emitting device with a particularly simple structure and a particularly high scalability is provided.

In an embodiment the first light guide is further adapted for receiving the first light with the first spectral distribution at a second surface which second surface extends parallel to and is arranged opposite to the first light input surface.

In this way more light can be coupled into the first light guide, leading to a further increase of the intensity of the light output.

In an embodiment the first light out-coupling element is chosen from the group comprising a roughening of a part of the first light input surface, a diffractive element, a refractive element, a reflective element, a scattering element, a shaped recess provided in the first light input surface, a shaped protrusion provided on the first light input surface, a luminescent element, a pixilated luminescent element and combinations thereof.

By providing a light out-coupling element in the form of any one of a roughening of a part of the first light input surface, a diffractive element, a refractive element, a reflective element, a scattering element, a shaped recess provided in the first light input surface and a shaped protrusion provided on the first light input surface, a light emitting device having a particularly simple structure with efficient coupling of light out of the light exit surface by means of the light out-coupling element is provided.

By providing a light out-coupling element in the form of a luminescent element or a pixilated luminescent element a light emitting device is provided with which the color of the light coupled out of the light exit surface by means of the light out-coupling element may be controlled, particularly to provide a light output of the light emitting device having or consisting of more than one color, such as white light.

In an embodiment the first light out-coupling element for coupling light out of the first light input surface comprises at least two regions with different optical characteristics, the at least two regions being arranged adjacent to one another in any one of a direction parallel to the first light input surface and a direction substantially perpendicular to the first light input surface.

Thus, the characteristics of the light output may be further tuned by providing two regions with different optical characteristics, for example comprising different wavelength converting materials.

In an embodiment the light emitting device further comprises a second light out-coupling element for coupling light out of a second surface, the second light out-coupling element being arranged in or on a surface of the first light guide opposite the first light out-coupling element and which second surface extends parallel to and is arranged opposite to the first light input surface and opposite to the first light out-coupling element.

By the above mentioned embodiment a light emitting device is provided with which light may be coupled out in more than one direction simultaneously.

By arranging the second light out-coupling element on a surface parallel and opposite to the first light input surface and particularly in a position opposite to the first light out-coupling element, the second light out-coupling element may be used for coupling out light reflected back into the light guide by the first light out-coupling element. This arrangement is particularly advantageous in case of a reflective first light out-coupling element.

In embodiments further surfaces are provided with one light out-coupling element. For example, a bar or rod may be provided with the four longitudinal surfaces arranged as surfaces in which on each surface a light out-coupling element is arranged. In a further embodiment the four light out-coupling structures are arranged as one continuous light out-coupling element extending around the light guide. In another embodiment the light guide is a cylinder wherein a continuous, circular light out-coupling element surrounds the cylinder.

In embodiments the area of the first light out-coupling element is more than two times smaller than the area of the first light input surface, more than ten times smaller than the area of the first light input surface or more than one hundred times smaller than the area of the first light input surface.

By decreasing the area of the first light out-coupling element the intensity of the light output may be further increased, particularly as light is only coupled out of the light guide at the first light out-coupling element.

In an embodiment the light emitting device further comprises any one or more of a first reflective element being arranged at or on at least one of one or more further surfaces of the first light guide, a second reflective element arranged at a surface that extends parallel to and is arranged opposite to the first light input surface, and at least one third reflective element arranged at a part of the first light input surface.

Providing the light guide of the light emitting device with a first reflective element positioned at a further surface of the light guide, particularly a further surface extending parallel to and opposite to the desired light exit surface, results in that the light rays incident on this first reflective element will be reflected back through the light guide to the desired light exit surface of the light guide, where the light rays may leave the light guide.

Providing the light guide of the light emitting device with at least one third reflective element arranged at the first light input surface further adds to the above effect.

Thereby the light intensity of the light leaving through the desired light exit surface is increased.

By furthermore providing a second reflective element positioned at a surface that extends parallel to and is arranged opposite to the first light input, the light rays that hit this second reflective element are reflected back into the light guide towards the opposite surface at or on which the first out-coupling element is arranged. Thereby, the light intensity of the light leaving the light guide at the first light out-coupling element may be increased further.

In this way the amount of light lost through light guide surfaces other than the light exit surface is reduced considerably. Thus, a considerable increase in the intensity of the light emitted by the light emitting device is obtained. Also, higher surface intensities at the first light out-coupling element is obtained, which in turn provides for a higher luminous output being advantageous particularly in applications like projectors, e.g. light valve projectors, spot lights, vehicle head lights etc.

In an embodiment the light emitting device further comprises a plurality of second light sources adapted for, in operation, emitting third light with a third spectral distribution, and a second light guide comprising a second light input surface, the second light guide being adapted for receiving the third light with the third spectral distribution at the second light input surface, converting at least a part of the third light with the third spectral distribution to fourth light with a fourth spectral distribution, and guiding the fourth light to the second light input surface, the light emitting device further comprising one third light out-coupling element for coupling light out of the second light input surface, the third light out-coupling element being arranged in or on the second light input surface at a pre-selected location on a plane in which the second light input surface extends.

In an embodiment the third light out-coupling element is arranged in or on the second light input surface at the center of a plane in which the third light exit surface extends.

In an embodiment the second light input surface comprises a circumferential edge, and the third light out-coupling element is arranged at a point on the second light input surface, which point is located where any one distance perpendicular to the circumferential edge is the largest possible, all distances perpendicular to the circumferential edge being given equal weight.

In an embodiment the first light guide and the second light guide are arranged in such a way with respect to each other that the plane of the first light input surface and the plane of the second light input surface face away from each other. This provides for a light emitting device which emits light in at least two directions.

In an embodiment the first light out-coupling element and the third light out-coupling element are provided as one common light out-coupling element. In a further embodiment the common light out-coupling element extends at least partially around the first and second light guide.

These embodiments provide for a light emitting device emitting light with an even higher intensity or brightness and having an even more improved scalability, particularly as the emitting surface area may simply be increased by adding further light guides to the light emitting device. Furthermore, these embodiments provide for further parameters usable for obtaining different geometrical configurations of the light emitting device and/or of the color, size and shape of the beam of light emitted by the light emitting device.

The invention furthermore relates to a lamp, a luminaire, or a lighting system comprising a light emitting device according to any one of the previous claims, the lamp, luminaire and system being used in one or more of the following applications: digital projection, automotive lighting, stage lighting shop lighting, home lighting, accent lighting, spot lighting, theater lighting, fiber optic lighting, display systems, warning lighting systems, medical lighting applications, decorative lighting applications.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

Figure 1:
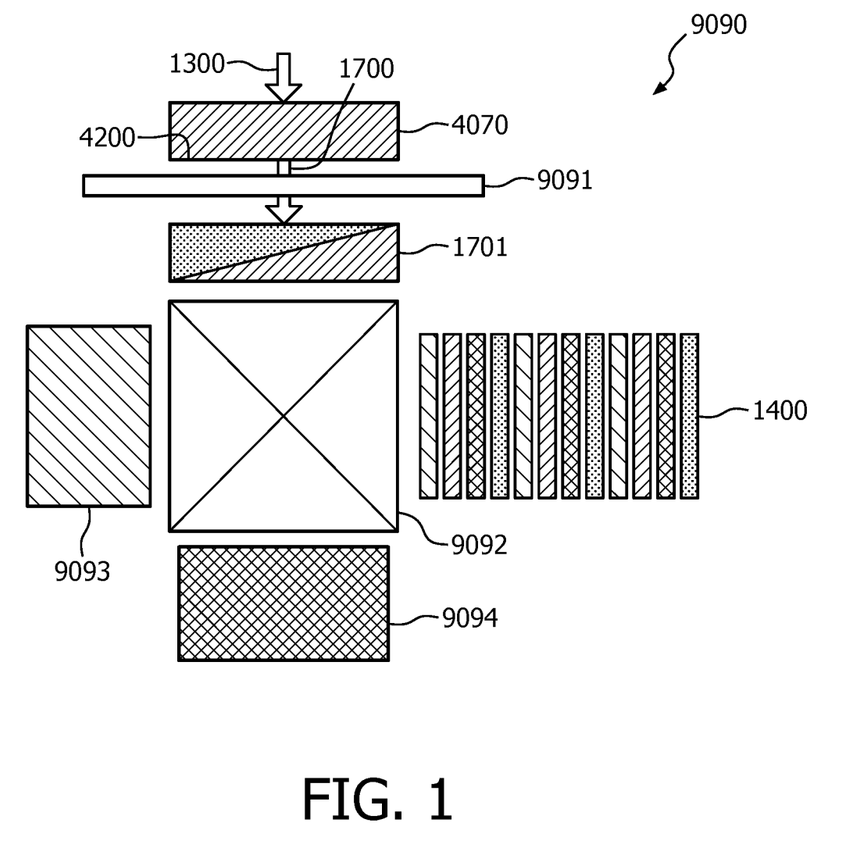
FIG. 1 shows a side view of a light guide which at an exit surface is provided with a filter for providing a filtered light output and a dichroic optical element for combining the filtered light output with light from additional light sources.
Figure 2A:
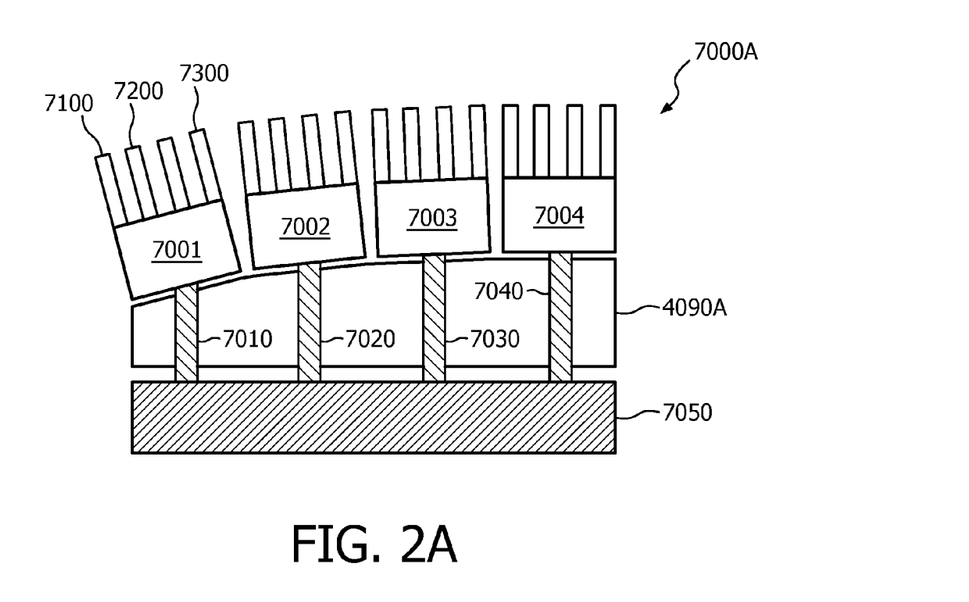
FIGS. 2A and 2B show two different embodiments of a light guide provided with a heat sink element arranged adjacent a surface of the light guide.
Figure 2B:
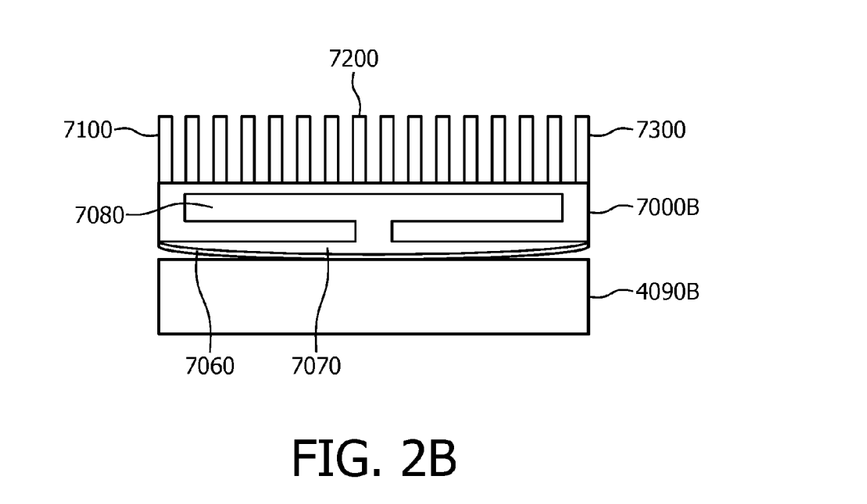

As illustrated in the figures, the sizes of layers, elements and regions are exaggerated for illustrative purposes and, thus, are provided to illustrate the general structures of embodiments of the present invention. Like reference numerals refer to like elements throughout, such that e.g. a light emitting device according to the invention is generally denoted 1, whereas different specific embodiments thereof are denoted by adding 01, 02, 03 and so forth to the general reference numeral. With regard to FIGS. 1 to 2B showing a number of features and elements which may be added to any one of the embodiments of a light emitting device according to the invention as set forth further below, generally "00" has been added to all elements except those specific to one of these Figures.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The following description will start with general considerations regarding applications, suitable light sources and suitable materials for various elements and features of a light emitting device according to the invention. For this purpose a number of features and elements which may be added to any one of the embodiments of a light emitting device according to the invention as set forth further below will be described with reference to FIGS. 1, 2A and 2B. The specific embodiments of a light emitting device according to the invention will be described in detail with reference to FIGS. 3 to 10.

A light emitting device according to the invention may be used in applications including but not being limited to a lamp, a light module, a luminaire, a spot light, a flash light, a projector, a digital projection device, automotive lighting such as e.g. a headlight or a taillight of a motor vehicle, arena lighting, theater lighting and architectural lighting.

Light sources which are part of the embodiments according to the invention as set forth below, are adapted for, in operation, emitting light with a first spectral distribution. This light is subsequently coupled into a light guide or waveguide. The light guide or waveguide converts the light of the first spectral distribution to another spectral distribution and guides the light to an exit surface. The light source may in principle be any type of point light source, but is preferably a solid state light source such as a Light Emitting Diode (LED), a Laser Diode or Organic Light Emitting Diode (OLED), a plurality of LEDs or Laser Diodes or OLEDs or an array of LEDs or Laser Diodes or OLEDs. The LED may in principle be an LED of any color, but is preferably a blue light source producing light source light in the blue color-range which is defined as a wavelength range of between 380 nm and 495 nm. In another preferred embodiment, the light source is an UV or violet light source, i.e. emitting in a wavelength range of below 420 nm. In case of a plurality or an array of LEDs or Laser Diodes or OLEDs, the LEDs or Laser Diodes or OLEDs may in principle be LEDs or Laser Diodes or OLEDs of two or more different colors, such as, but not limited to, UV, blue, green, yellow or red.

The light source may be a red light source, i.e. emitting in a wavelength range of e.g. between 600 nm and 800 nm. Such a red light source may be e.g. a red light source of any of the above mentioned types directly emitting red light or provided with a phosphor suitable for converting the light source light to red light. This is particularly preferred in combination with a light guide adapted for converting the light source light to IR light, i.e. light with a wavelength of more than about 800 nm and preferably with a peak intensity in the range from 810 to 850 nm. Such a light guide may comprise an IR emitting phosphor. A light emitting device with these characteristics is especially advantageous for use in night vision systems, but may also be used in any of the applications mentioned above.

Another example is combination of a first, red light source emitting light in a wavelength range between 480 nm and 800 nm and coupling this light into a luminescent rod or waveguide, and a second light source, emitting blue or UV or violet light, i.e. with a wavelength smaller than 480 nm, and also coupling its emitted light into the luminescent waveguide or rod. The light of the second light source is converted by the luminescent waveguide or rod to a wavelength range between 480 nm and 800 nm, and the light of the first light source coupled into the luminescent waveguide or rod will not be converted. In other words, the second light source emits UV, violet or blue light and is subsequently converted by the luminescent concentrator into light in the green-yellow-orange-red spectral region. In another embodiment the first light source emits in a wavelength range between 500 nm and 600 nm, and the light of the second light source is converted by the luminescent waveguide or rod to a wavelength range between 500 nm and 600 nm. In another embodiment the first light source emits in a wavelength range between 600 nm and 750 nm, and the light of the second light source is converted by the luminescent waveguide or rod to a wavelength range between 600 nm and 750 nm. In an embodiment the light of the first light source is coupled into the luminescent waveguide or rod at another surface, for example a surface opposite to an exit surface of the light, than a surface where the light of the second light source is coupled into the luminescent waveguide or rod. These embodiments provide a luminescent waveguide or rod emitting in the red light range with an increased brightness.

The light guides as set forth below in embodiments according to the invention are rod shaped or bar shaped light guides comprising a height H, a width W, and a length L extending in mutually perpendicular directions and are in embodiments transparent, or transparent and luminescent. The height H is in embodiments <10 mm, in other embodiments <5, in yet other embodiments <2 mm. The width W is in embodiments <10 mm, in other embodiments <5, in yet other embodiments <2 mm. The length L is in embodiments larger than the width W and the height H, in other embodiments at least 2 times the width W or 2 times the height H, in yet other embodiments at least 3 times the width W or 3 times the height H. The aspect ratio of the Height H: Width W is typically 1:1 (for e.g. general light source applications) or 1:2, 1:3 or 1:4 (for e.g. special light source applications such as headlamps) or 4:3, 16:10, 16:9 or 256:135 (for e.g. display applications).

Generally the light guides comprise a light input surface and a light exit surface. In order to achieve a high brightness, concentrated, light output, the area of light exit surface may be smaller than the area of the light input surface. The light exit surface can have any shape, but is preferably shaped as a square, rectangle, round, oval, triangle, pentagon, or hexagon.

Transparent light guides may in embodiments comprise a transparent substrate on which a plurality of light sources, for example LEDs, are grown epitaxially. The substrate is in embodiments a single crystal substrate, such as for example a sapphire substrate. The transparent growth substrate of the light sources is in these embodiments the light concentrating light guide.

The generally rod shaped or bar shaped light guide can have any cross sectional shape, but in embodiments has a cross section the shape of a square, rectangle, round, oval, triangle, pentagon, or hexagon.

Suitable materials for light guides as set forth below according to embodiments of the invention are sapphire, polycrystalline alumina and/or undoped transparent garnets such as YAG, LuAG having a refractive index of n=1.7. An additional advantage of this material (above e.g. glass) is that it has a good thermal conductivity, thus diminishing local heating. Other suitable materials include, but are not limited to, glass, quartz and transparent polymers. In other embodiments the light guide material is lead glass. Lead glass is a variety of glass in which lead replaces the calcium content of a typical potash glass and in this way the refractive index can be increased. Ordinary glass has a refractive index of n=1.5, while the addition of lead produces a refractive index ranging up to 1.7.

The light guides as set forth below according to embodiments of the invention may comprise a suitable luminescent material for converting the light to another spectral distribution. Suitable luminescent materials as used in the invention include inorganic phosphors, such as doped YAG, LuAG, organic phosphors, organic fluorescent dyes and quantum dots which are highly suitable for the purposes of embodiments of the of the present invention as set forth below.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having very low cadmium content.

Organic fluorescent dyes can be used as well. The molecular structure can be designed such that the spectral peak position can be tuned. Examples of suitable organic fluorescent dyes materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

The luminescent material may also be an inorganic phosphor. Examples of inorganic phosphor materials include, but are not limited to, cerium (Ce) doped YAG ($Y_3Al_5O_{12}$) or LuAG ($Lu_3Al_{15}O_{12}$). Ce doped YAG emits yellowish light, whereas Ce doped LuAG emits yellow-greenish light. Examples of other inorganic phosphors materials which emit red light may include, but are not limited to ECAS and BSSN; ECAS being $Ca_{1-x}AlSiN_3:Eu_x$ wherein $0<x\leq1$, preferably $0<x\leq0.2$; and BSSN being $Ba_{2-x-z}M_xSi_5-yAl_yN_{8-y}O_y$:

Eu$_z$ wherein M represents Sr or Ca, 0≤x≤1, 0≤y≤4, and 0.0005≤z≤0.05, and preferably 0≤x≤0.2.

According to a preferred embodiment of the present invention, the luminescent material is essentially made of material selected from the group comprising (M<I>$_{(1-x-y)}$ M<II>$_x$M<III>$_y$)$_3$(M<IV>$_{(1-z)}$M<V>$_z$)$_5$O$_{12}$— where M<I>is selected from the group comprising Y, Lu or mixtures thereof, M<II>is selected from the group comprising Gd, Tb, La, Yb or mixtures thereof, M<III>is selected from the group comprising Tb, Pr, Ce, Er, Nd, Eu or mixtures thereof, M<IV>is Al, M<V>is selected from the group comprising Ga, Sc or mixtures thereof, and 0≤x≤1, 0≤y≤0.1, 0≤z≤1, (M<I>$_{(1-x-y)}$M<II>$_x$ M<III>$_y$)$_2$O$_3$ where M<I>is selected from the group comprising Y, Lu or mixtures thereof, M<II>is selected from the group comprising Gd, La, Yb or mixtures thereof, M<III>is selected from the group comprising Tb, Pr, Ce, Er, Nd, Eu, Bi, Sb or mixtures thereof, and 0≤x≤1, 0≤y≤0.1, (M<I>$_{(1-x-y)}$M<II>$_x$ M<III>$_y$) S$_{(1-z)}$Se$_z$ where M<I>is selected from the group comprising Ca, Sr, Mg, Ba or mixtures thereof, M<II>is selected from the group comprising Ce, Eu, Mn, Tb, Sm, Pr, Sb, Sn or mixtures thereof, M<III>is selected from the group comprising K, Na, Li, Rb, Zn or mixtures thereof, and 0≤x≤0.01, 0≤y≤0.05, 0≤z≤1, (M<I>$_{(1-x-y)}$M<II>$_x$ M<III>$_y$)O where M<I>is selected from the group comprising Ca, Sr, Mg, Ba or mixtures thereof, M<II>is selected from the group comprising Ce, Eu, Mn, Tb, Sm, Pr or mixtures thereof, M<III>is selected from the group comprising K, Na, Li, Rb, Zn or mixtures thereof, and 0≤x≤0.1, 0≤y≤0.1, (M<I>$_{(2-x)}$ M<II>$_x$ M<III>$_2$)O$_7$ where M<I>is selected from the group comprising La, Y, Gd, Lu, Ba, Sr or mixtures thereof, M<II>is selected from the group comprising Eu, Tb, Pr, Ce, Nd, Sm, Tm or mixtures thereof, M<III>is selected from the group comprising Hf, Zr, Ti, Ta, Nb or mixtures thereof, and 0<=x<=1, (M<I>$_{(1-x)}$M<II>$_x$ M<III>$_{(1-y)}$M<IV>$_y$)O$_3$ where M<I>is selected from the group comprising Ba, Sr, Ca, La, Y, Gd, Lu or mixtures thereof, M<II>is selected from the group comprising Eu, Tb, Pr, Ce, Nd, Sm, Tm or mixtures thereof, M<III>is selected from the group comprising Hf, Zr, Ti, Ta, Nb or mixtures thereof, and M<IV>is selected from the group comprising Al, Ga, Sc, Si or mixtures thereof, and 0≤x≤0.1, 0≤y≤0.1, or mixtures thereof.

A luminescent light guide may comprises a central emission wavelength within a blue color-range or within a green color-range or within a red color-range. The blue color-range is defined between 380 nanometer and 495 nanometer, the green color-range is defined between 495 nanometer and 590 nanometer, and the red color-range is defined between 590 nanometer and 800 nanometer.

A selection of phosphors which may be used in embodiments, alternative to or in addition to the phosphors described above, is given in table 1 below along with the maximum emission wavelength.

TABLE 1

| Phosphor | Maximum emission wavelength [nm] |
|---|---|
| CaGa$_2$S$_4$:Ce | 475 |
| SrGa$_2$S$_4$:Ce | 450 |
| BaAl$_2$S$_4$:Eu | 470 |
| CaF$_2$:Eu | 435 |
| Bi$_4$Si$_3$O$_{12}$:Ce | 470 |
| Ca$_3$Sc$_2$Si$_3$O$_{12}$:Ce | 490 |

The light guides as set forth below according to embodiments of the invention may comprise regions with a different density of suitable luminescent material for converting the light to another spectral distribution. In an embodiment a transparent light guide comprises two parts adjacent to each other and only one of which comprises a luminescent material and the other part is transparent or has a relatively low concentration of luminescent material. In another embodiment the light guide comprises yet another, third part, adjacent to the second part, which comprises a different luminescent material or a different concentration of the same luminescent material. The different parts may be integrally formed thus forming one piece or one light guide. In an embodiment a partially reflecting element may be arranged between the different parts of the light guide, for example between the first part and the second part. The partially reflecting element is adapted for transmitting light with one specific wavelength or spectral distribution and for reflecting light with another, different, specific wavelength or spectral distribution. The partially reflecting element may thus be a dichroic element such as a dichroic mirror.

In embodiments of the light emitting device according to the invention as set forth below a coupling structure or a coupling medium may be provided for efficiently coupling the light emitted by the light source into the light guide. The coupling structure may be a refractive structure having features, such as e.g. protrusions and recesses forming a wave shaped structure. The typical size of the features of the coupling structure is 5 μm to 500 μm. The shape of the features may be e.g. hemispherical (lenses), prismatic, sinusoidal or random (e.g. sand-blasted). By choosing the appropriate shape, the amount of light coupled into the light guide can be tuned. The refractive structures may be made by mechanical means such as by chiseling, sand blasting or the like. Alternatively, the refractive structures may be made by replication in an appropriate material, such as e.g. polymer or sol-gel material. Alternatively, the coupling structure may be a diffractive structure, where the typical size of the features of the diffractive coupling structure is 0.2 μm to 2 μm. The diffraction angles $\theta_{in}$ inside the light guide are given by the grating equation $\lambda/\Lambda = n_{in} \sin \theta_{in} - n_{out} \sin \theta_{out}$, where $\lambda$ is the wavelength of LED light, $\Lambda$ is the grating period, $n_{in}$ and $n_{out}$ are the refractive indices inside and outside the light guide, $\theta_{in}$ and $\theta_{out}$ are the diffraction angle inside and incident angle outside the light guide, respectively. If we assume the same refractive index $n_{out}=1$ for low-index layer and coupling medium, we find, with the condition for total internal reflection $n_{in} \sin \theta_{in} = n_{out}$, the following condition: $\lambda/\Lambda = 1 - \sin \theta_{out}$, i.e. $\Lambda = \lambda$ for normal incidence $\theta_{out}=0$. Generally, not all other angles $\theta_{out}$ are diffracted into the light guide. This will happen only if its refractive index $n_{in}$ is high enough. From the grating equation it follows that for the condition $n_{in} \geq 2$ all angles are diffracted if $\Lambda = \lambda$. Also other periods and refractive indices may be used, leading to less light that is diffracted into the light guide. Furthermore, in general a lot of light is transmitted ($0^{th}$ order). The amount of diffracted light depends on the shape and height of the grating structures. By choosing the appropriate parameters, the amount of light coupled into the light guide can be tuned. Such diffractive structures most easily are made by replication from structures that have been made by e.g. e-beam lithography or holography. The replication may be done by a method like soft nano-imprint lithography. The coupling medium may e.g. be air or another suitable material.

FIG. 1 shows a side view of a lighting system, e.g. a digital projector, with a light guide 4070 which is adapted for converting incident light 1300 in such a way that the emitted light 1700 is in the yellow and/or orange wavelength range, i.e. roughly in the wavelength range of 560 nm to 600 nm. To this end the light guide 4070 may e.g. be provided as a transparent garnet made of ceramic materials such as Ce-doped $(Lu, Gd)_3Al_5O_{12}$, $(Y, Gd)_3Al_5O_{12}$ or $(Y, Tb)_3Al_5O_{12}$. With higher Ce-content and/or higher substitution levels of e.g. Gd and/or Tb in favor of Ce, the spectral distribution of the light emitted by the light guide can be shifted to higher wavelengths. Preferably, the light guide 4070 is fully transparent.

At the light exit surface 4200 an optical element 9090 is provided. The optical element 9090 comprises a filter 9091 for filtering the light 1700 emitted from the light guide 4070 such as to provide filtered light 1701, at least one further light source 9093, 9094 and an optical component 9092 adapted for combining the filtered light 1701 and the light from the at least one further light source 9093, 9094 such as to provide a common light output 1400.

The filter 9091 may be an absorption filter or a reflective filter, which may be fixed or switchable. A switchable filter may e.g. be obtained by providing a reflective dichroic mirror, which may be low-pass, band-pass or high-pass according to the desired light output, and a switchable mirror and placing the switchable mirror upstream of the dichroic mirror seen in the light propagation direction. Furthermore, it is also feasible to combine two or more filters and/or mirrors to select a desired light output. The filter 9091 shown in FIG. 1 is a switchable filter enabling the transmission of unfiltered yellow and/or orange light or filtered light, particularly and in the embodiment shown filtered red light, according to the switching state of the filter 9091. The spectral distribution of the filtered light depends on the characteristics of the filter 9091 employed. The optical component 9092 as shown may be a cross dichroic prism also known as an X-cube or it may in an alternative be a suitable set of individual dichroic filters.

In the embodiment shown two further light sources 9093 and 9094 are provided, the further light source 9093 being a blue light source and the further light source 9094 being a green light source. Other colors and/or a higher number of further light sources may be feasible too. A further option is to use the light filtered out by the filter 9091 as a further light source.

The common light output 1400 is thus a combination of light 1701 emitted by the light guide 4070 and filtered by the filter 9091 and light emitted by the respective two further light sources 9093 and 9094. The common light output 1400 may advantageously be white light.

The solution shown in FIG. 1 is advantageous in that it is scalable, cost effective and easily adaptable according to the requirements for a given application of a light emitting device according to the invention.

FIGS. 2A and 2B shows a side view of a light guide 4090A and a light guide 4090B, respectively, that comprise a heat sink element 7000A, 7000B, respectively, arranged on one of the surfaces of the light guide 4090A, 4090B, respectively, different from the light input surface, preferably in a distance of about 30 μm or less therefrom. Irrespective of the embodiment the respective heat sink element 7000A, 7000B comprises fins 7100, 7200, 7300 for improved heat dissipation, the fins, however, being optional elements. Irrespective of the embodiment the respective heat sink element 7000A, 7000B is a heat sink element adapted to be conformable to the surface shape of the light guide, and is thus adapted for providing a conformal thermal contact over the whole contact area with the light guide. Thereby improved cooling of the light guide is obtained and the existing tolerance limits on the positioning of the heat sink element become less critical.

FIG. 2A that the heat sink element 7000A comprises a plurality of heat sink parts, here four heat sink parts 7001, 7002, 7003 and 7004, one or more of which, here all four, may be provided with fins. Obviously, the more heat sink parts the heat sink element 7000A comprises, the more precisely the heat sink element 7000 may be conformed to the surface of the light guide. Each heat sink part 7001, 7002, 7003, 7004 is adapted for providing a conformal thermal contact over the whole contact area with the light guide. The heat sink parts may be arranged in mutually different distances from the surface of the light guide. Furthermore, the heat sink element 7000A comprises a common carrier 7050 to which the heat sink parts 7001, 7002, 7003 and 7004 are attached individually by means of attachment elements 7010, 7020, 7030 and 7040, respectively. Alternatively each heat sink part may be assigned its own carrier. It is noted that these elements are optional.

FIG. 2B shows that the heat sink element 7000B comprises a bottom part 7060 adapted to be conformable to the shape of the surface of the light guide 4090B at which it is to be arranged. The bottom part 7060 is flexible and may e.g. be a thermally conductive metal layer such as a copper layer. The heat sink element 7000B further comprises a thermally conductive layer 7070 arranged between the bottom element 7060 and the remainder of the heat sink element 7000B for improved flexibility and conformability of the heat sink element 7000B. The thermally conductive layer 7070 may e.g. be a thermally conductive fluid or paste. The thermally conductive layer 7070 is preferably highly reflective and/or comprises a highly reflective coating. The heat sink element 7000B further comprises a fluid reservoir 7080 arranged inside the heat sink element 7000B for generating a fluid flow for improved heat dissipation. In an alternative, the fluid reservoir 7080 may also be arranged externally on the heat sink element 7000B, e.g. extending along a part of or the whole external periphery of the heat sink element 7000B. The fluid flow may be enhanced by means of a pump. It is noted that the conductive layer 7070 and the fluid reservoir 7080 are optional elements.

Irrespective of the embodiment, the heat sink element 7000A, 7000B may be made of a material selected from copper, aluminum, silver, gold, silicon carbide, aluminum nitride, boron nitride, aluminum silicon carbide, beryllium oxide, silicon-silicon carbide, aluminum silicon carbide, copper tungsten alloys, copper molybdenum carbides, carbon, diamond, graphite, and combinations of two or more thereof. Furthermore, a heat sink element combining features of the embodiments described above is feasible. Also, it is feasible to arrange a heat sink element according to any of the above embodiments at more than one surface of the light guide 4090A or 4090B.

Finally it is noted that the provision of a heat sink element as described above is especially advantageous in embodiments of a light emitting device employing a light source emitting in the red wavelength range and/or being adapted for emitting light in the infrared wavelength range, e.g. by comprising an IR emitting phosphor.

Figure 3:
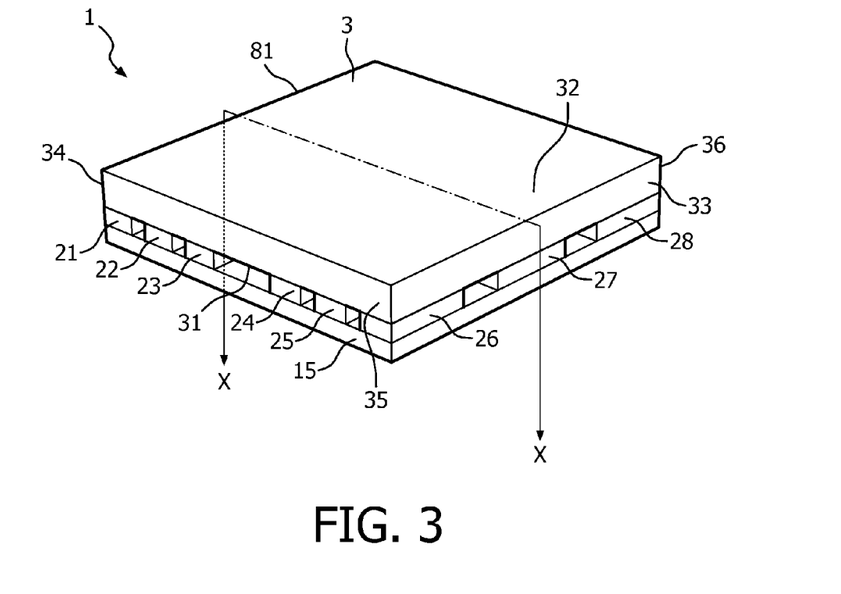
FIG. 3 shows a perspective view of an embodiment of a light emitting device according to the invention.
Figure 4:
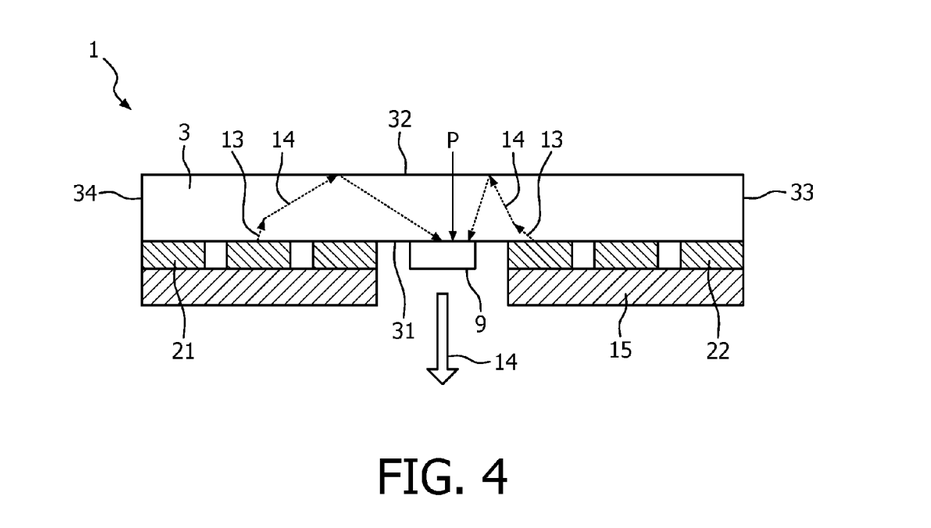
FIG. 4 shows a cross sectional view along the line X-X of the light emitting device according to FIG. 3.

FIG. 3 shows a perspective view of a light emitting device 1 according to a first and general embodiment of the invention and FIG. 4 shows a cross sectional view of the light emitting device 1 along the line X-X of the light emitting device according to FIG. 3. The light emitting device 1 generally comprises a plurality of first light sources 21, 22, 23, 24, 25, 26, 27, 28 of which only some are visible in FIG. 3, a first light guide 3 and one light out-coupling element 9 for coupling light out of the light guide, which is not visible in FIG. 3.

The light sources described herein are preferably solid state light sources such as LEDs, suitable types of LEDs being described above. The plurality of first light sources 21, 22, 23, 24, 25, 26, 27, 28 preferably all emit light having the same spectral distribution, but may in alternative embodiments emit light having two or more different spectral distributions.

The first light sources 21, 22, 23, 24, 25, 26, 27, 28 are arranged on a base or substrate 15 in the form of a heat sink, preferably made of a metal such as copper, iron or aluminum. The heat sink may comprise fins (not shown) for improved heat dissipation. It is noted that in other embodiments the base or substrate need not be a heat sink. By providing a heat sink the heat produced by the light source may be dissipated away from the light guide in an efficient manner. This in turn provides for a raise in the maximum obtainable output light intensity of the light emitting device as well as for lowering or even eliminating the adverse effects on the optical performance of the light emitting device caused by excess heat in the light guide. The heat sink is, however, not an essential element, and may thus be omitted in yet other embodiments.

As may be seen the first light sources are in the present embodiment arranged in two 3×3 arrays each having a total of nine first light sources. The first light sources 21-28 shown in FIG. 3 are rectangular. However, the first light sources may just as well be square. It is noted that in principle any other number of first light sources may be present, such as e.g. ten, twenty or thirty first light sources.

The first light guide 3 is shown shaped generally as a square plate having a first light input surface 31 and a second surface 32 extending parallel with respect to each other such that the first light input surface 31 and the second surface 32 are a lower and an upper surface of the first light guide 3, respectively. The first light guide 3 further comprises side surfaces 33, 34, 35, 36. The first light guide 3 may also be bar or rod shaped, shaped like a cross, a multiple cross, a disc or a hexagon or shaped e.g. as a rectangular, round or hexagonal plate. The first light sources 21, 22, 23, 24, 25, 26, 27, 28 are arranged adjacent to and in optical contact with the first light input surface 31 of the first light guide 3.

Furthermore, the first light guide 3 may comprise a transparent material, a luminescent material, a garnet, a light concentrating material or a combination thereof, suitable materials and garnets being described above. In any case, the first light guide 3 is a light guide adapted for or capable of converting light with one spectral distribution to light with a different or partially overlapping spectral distribution. Hence, it is also feasible that the first light guide may comprise two parts in mutual optical contact, one part being transparent and the other part being adapted for or capable of converting light with one spectral distribution to light with a different or partially overlapping spectral distribution.

Thus, in embodiments the first light guide 3 is a transparent light guide comprising a material adapted for converting light with one spectral distribution to light with a second spectral distribution. The material adapted for converting light with one spectral distribution to light with a second spectral distribution may be arranged at a surface of the first light guide 3, and is in embodiments embedded in the first light guide 3.

The light emitting device 1 further comprises one first light out-coupling element 9 for coupling light out of the light guide. Generally, the first light out-coupling element is arranged in or on a surface of the light guide at a pre-selected location on a plane in which this surface extends. According to the invention the first light out-coupling element 9 is arranged on the first light input surface 31. Thus, according to the invention, the first light input surface 31 functions partially as a light input surface region by receiving light that is emitted by the first light sources 21, 22, 23, 24, 25, 26, 27, 28 and partially as a light exit surface region by exiting the light via the first out-coupling element 9. In other words, the light input surface and light exit surface are segments or areas of the same plane or surface of the light guide.

The first light out-coupling element 9 is, according to the invention, arranged at the center of a plane in which the surface, on which the first light out-coupling element 9 is arranged, extends. More particularly, the surface on which the first light out-coupling element 9 is arranged comprises a circumferential edge 81, the first light out-coupling element 9 is arranged at a point P on this surface and the point P is located where any one distance perpendicular to the circumferential edge 81 is the largest possible, wherein all distances perpendicular to the circumferential edge 81 are given equal weight.

It is noted, however, that the position of the first light out-coupling element 9 is not limited to the position shown in FIG. 4, but may in principle be any pre-selected position on a surface of the first light guide 3. Furthermore, the first light out-coupling element 9 may in principle be any one of the types described below with reference to FIGS. 5A to 5G.

With reference to FIG. 4 a light emitting device according to the invention generally works as follows. First light 13 having a first spectral distribution is emitted by each light source of the plurality of first light sources 21, 22, 23, 24, 25, 26, 27, 28. The first light 13 having the first spectral distribution is then coupled into the first light guide 3 at a part of the first light input surface 31. At least a part of the first light 13 with the first spectral distribution is converted by the light guide 3 to second light 14 having a second spectral distribution. The light guide will be designed such that a major part of the first light 13 will be absorbed and only a small amount of first light 13 will be waveguided in the light guide. This can be achieved by providing for a conversion material in the light guide that has a sufficiently high absorbance in the direction the first light 13 is travelling, suitable examples of such materials being specified above. Finally, the second light 14 having the second spectral distribution is coupled out of the first light guide 3 by means of the first light out-coupling element 9, and is thus emitted by the light emitting device 1. The second light 14 is isotropically emitted in the light guide after the wavelength conversion. The refractive index of the material of the light guide determines the critical angle for exiting of light from a surface of the light guide. For example, in case the refractive index of the material of the light guide has a value of 1.8, the critical angle will be around 33° (via sin(critical angle)=1/(refractive index)) and about 6% of the second light escapes or exits from each surface of the light guide. Hence, by selecting an optimum refractive index of the light guide, a majority of the second light 14 will be waveguided in the light guide. The area of emission is confined to the size of the first light out-coupling element 9, thereby obtaining a light concentrating effect.

FIGS. 5A to 5G illustrate different types of possible first light out-coupling elements for coupling light out of the first light guide 3 are shown.

Figure 5A:
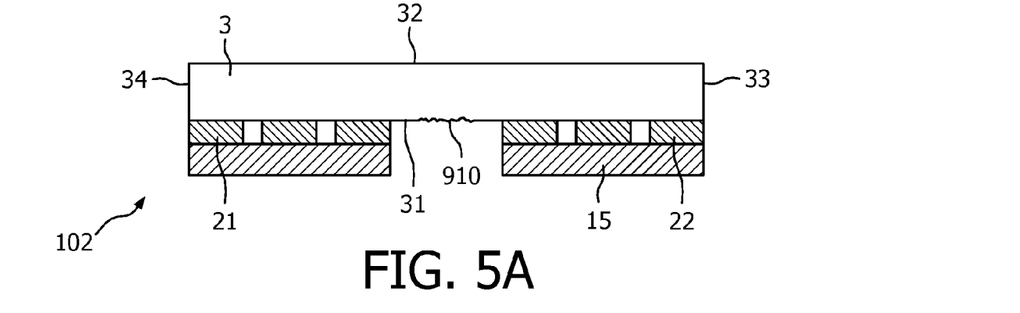
FIG. 5A-5G show end views of different embodiments of a light emitting device according to the invention featuring different light out-coupling elements for coupling light out of a light guide of the light emitting device.

The light emitting device 102 shown in FIG. 5A comprises a first light out-coupling element 910 in the form of a roughened surface provided on a pre-selected part of the first light input surface 31 of the first light guide 3.

Figure 5B:
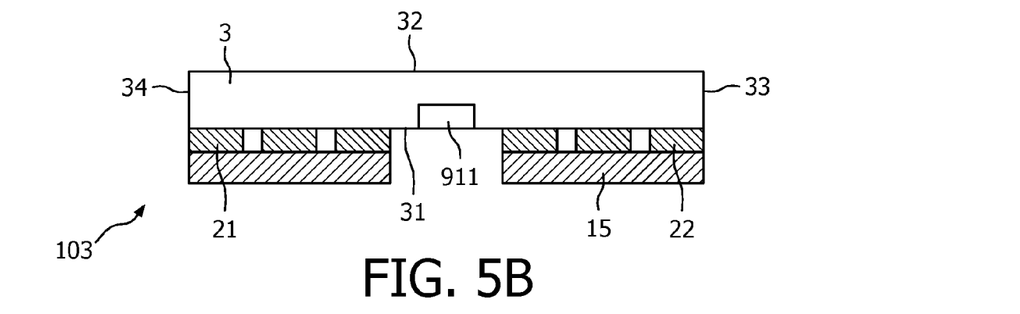

The light emitting device 103 shown in FIG. 5B comprises a first light out-coupling element 911 in the form of a light redirecting element, such as preferably a scattering element being reflective to only some wavelengths of light, or a diffractive element or a refractive element or a reflective element embedded in a pre-selected part of the first light input surface 31 of the first light guide 3.

Figure 5C:
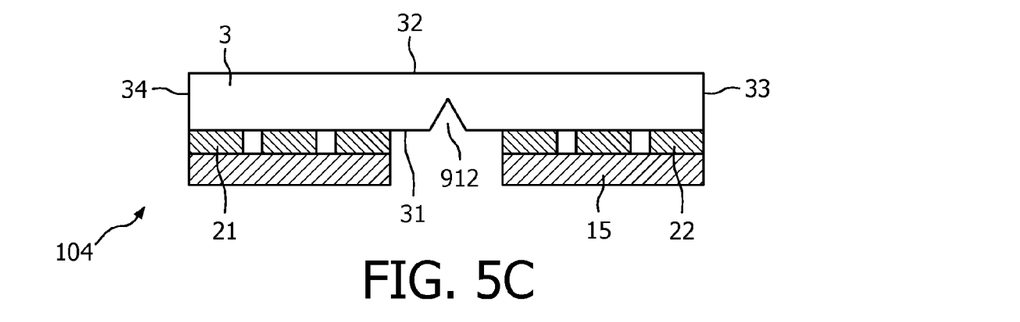

The light emitting device 104 shown in FIG. 5C comprises a first light out-coupling element 912 provided by shaping a pre-selected part of the first light input surface 31 of the first light guide 3. As shown on FIG. 5C the first light out-coupling element 912 is provided in the form of an indentation or recess in the first light input surface 31. In an alternative embodiment the shaping may just as well be a protrusion arranged on the first light input surface 31. Furthermore, whether an indentation or a protrusion, the shape of the light out-coupling element 912 is not limited to the triangular shape shown in FIG. 5C, but may also be any other feasible shape, such as quadrangular, curved or the like.

Figure 5D:
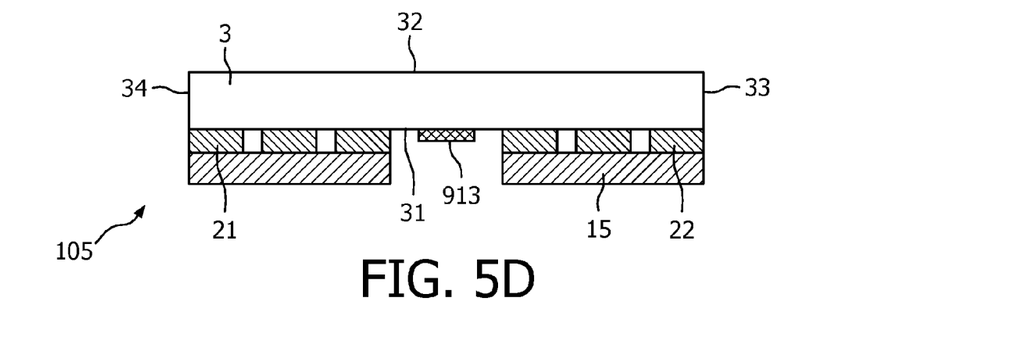

The light emitting device 105 shown in FIG. 5D comprises a first light out-coupling element 913 provided on a pre-selected part of the first light input surface 31 of the first light guide 3 and comprising a phosphor such as to enable a further wavelength conversion of the extracted light. In an alternative but closely related embodiment the light out-coupling element 913 may be provided as a phosphor for light extraction via scattering and partial wavelength conversion.

Figure 5E:
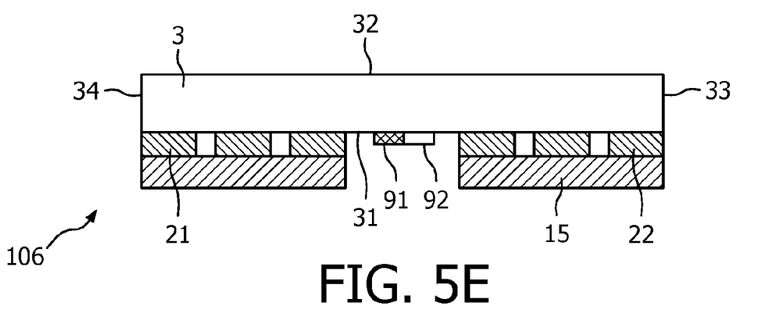

The light emitting device 106 shown in FIG. 5E comprises one first light out-coupling element comprising two regions 91, 92 with different optical characteristics in the form of two different luminescent elements, preferably phosphors, arranged adjacent to one another in a direction parallel to the first light input surface 31 and provided on a pre-selected part of the first light input surface 31 of the first light guide 3. Alternatively, each of the two regions 91, 92 may in principle be regions with properties and configuration analogous to any one of the types of light out-coupling elements described herein.

Figure 5F:
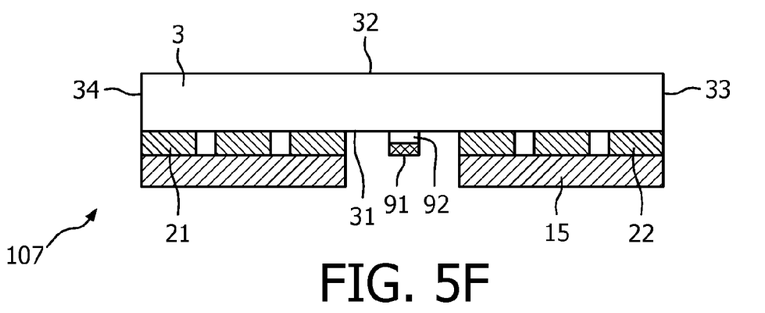

The light emitting device 107 shown in FIG. 5F comprises one first light out-coupling element comprising two regions 91, 92 with different optical characteristics in the form of two different luminescent elements, preferably phosphors, arranged adjacent one another in a direction substantially perpendicular to the first light input surface 31 and provided on a pre-selected part of the first light input surface 31 of the first light guide 3. The two regions 91, 92 are in this case stacked regions. Alternatively, the two regions 91, 92 may in principle each be regions with properties and configuration analogous to any one of the types of light out-coupling elements described herein.

Also, it is feasible to provide the first light out-coupling element with three or more regions.

Figure 5G:
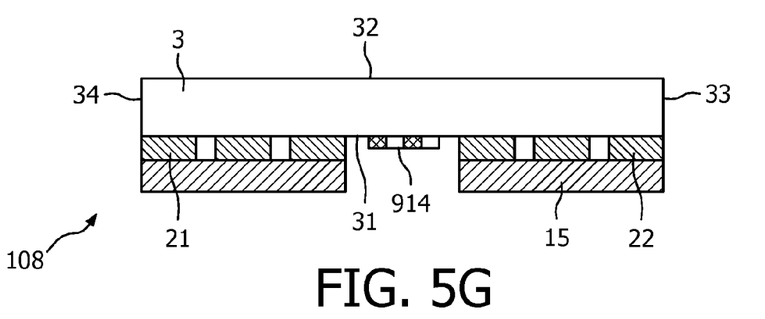

The light emitting device 108 shown in FIG. 5G comprises a first light out-coupling element 914 in the form of a pixilated luminescent element, preferably a pixilated phosphor, provided on a pre-selected part of the first light input surface 31 of the first light guide 3. This embodiment is particularly suitable for light emitting devices desired to emit white light.

Irrespective of the particular embodiment, the first light out-coupling element 9 or each of the at least two regions thereof may be provided in a size and/or shape adapted to provide a desired spot size and/or spot shape of the light emitted by the light emitting device.

Figure 6:
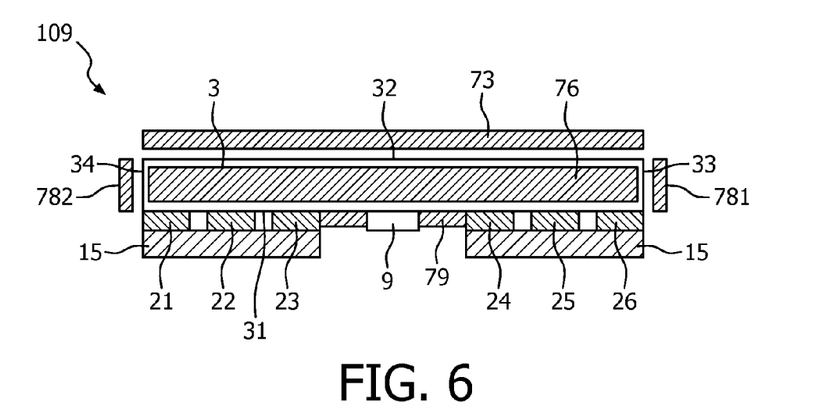
FIG. 6 shows an end view of an embodiment of a light emitting device according to the invention.

FIG. 6 shows an end view an embodiment of a light emitting device 109 according to the invention which differs from that shown in FIGS. 3 and 4 and described above in that it comprises first, second and third reflective elements 76, 781, 782, 79, 73 provided to reduce or even eliminate the amount of light that is otherwise lost through other surfaces or other parts of a surface than the part on or in which the light out-coupling element 9 is arranged.

More particularly, the light emitting device 109 comprises a first reflective element 781, 782, 76 being arranged at or on at least one of one or more further surfaces 33, 34, 35, 36 of the first light guide, a second reflective element 73 arranged at the second surface 32 and at least one third reflective element 79 arranged at part of the first light input surface 31. The further surface 35, which is not visible in FIG. 6, may also be provided with a reflective element.

As shown, the third reflective element 79 is arranged in optical contact with the first light input surface 31, while in this example a gap is provided between the first and second reflective elements 73, 76, 781 782 and the light exit surface 32 and the further surfaces 33, 34, 36, respectively. Such a gap may be filled with e.g. air or an optical adhesive such as silicone or a glass material.

The first, second and third reflective elements may e.g. be a mirror plate, a mirror foil or a mirror coating which may be glued, e.g. by means of an optical adhesive, coated or deposited onto the respective surface of the light guide 3. Suitable deposition methods include but are not limited to thin film deposition methods, chemical deposition methods and physical deposition methods.

The respective first reflective elements 76, 781, 782 cover substantially the complete surface area of the respective surfaces 33, 34, 36 on which they are provided. The second reflective element 73 covers substantially the complete surface area of the second surface 32. The third reflective element 79 covers substantially the complete surface area of the light input surface 31 not being provided with light sources 21-26 and not being provided with the light out-coupling element 9.

The third reflective element 79 may, for example, be provided as two or more reflective elements arranged on the light input surface 31 on different sides of the light out-coupling element 9. Alternatively, the third reflective element 79 may comprise one reflective element with a transparent part, which defines the part of the light input surface 31 through which light may escape to be emitted from the light emitting device 109, wherein the through hole is provided with a shape corresponding to the shape of the light out-coupling element 9.

It is noted that not all the said reflective elements need to be present, and that only one or some of the reflective elements may be provided in other embodiments of the invention. Also, a light emitting device according to any embodiment described herein may be provided with one or more reflective elements as described above.

Figure 7:
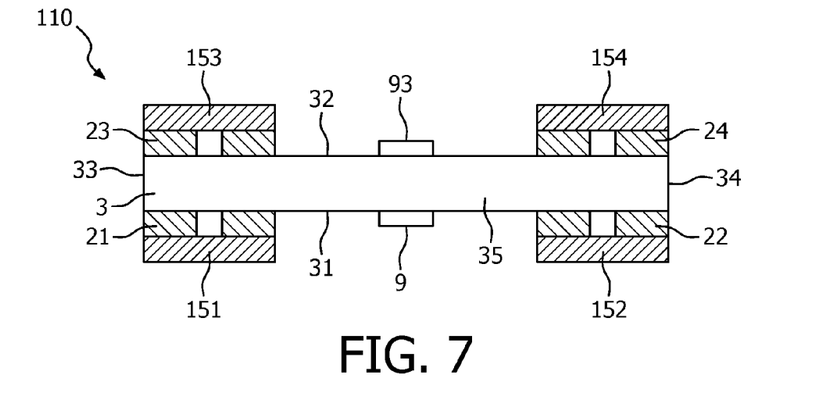
FIG. 7 shows an end view of an embodiment of a light emitting device according to the invention.

Turning now to FIG. 7, an end view of an embodiment of a light emitting device 110 according to the invention is shown. The light emitting device 110 differs from that shown in FIGS. 3 and 4 described above in two points.

Firstly, in addition to the first light sources 21 and 22 provided at the first light input surface 31, additional first light sources 23, 24 are also provided at another surface of the first light guide 3 opposite to the first light input surface 31, here the second surface 32. Hence, in the embodiment shown on FIG. 7 the first light sources 21 and 22 and the additional first light sources 23 and 24 are arranged on mutually opposite and parallel surfaces, such that for the additional first light sources 23 and 24 a part of the second surface 32 functions as a light input surface region. In other words, the first light input surface 31 functions partially as a light input surface region by receiving light that is emitted by the first light sources 21, 22 and partially as a light exit surface region by exiting the light via the first coupling structure 9, and the second surface 32 functions partially as a light input surface region by receiving light that is emitted by the (additional) first light sources 23, 24 and partially as a light exit surface region by exiting the light via a first coupling structure 93.

The first light sources 21, 22, 23, 24 are arranged on respective bases 151, 152, 153, 154. Thereby more light may be coupled into the first light guide 3 thus providing for a higher intensity and brightness of the light output from the first light guide 3.

Secondly, the second light out-coupling element 93 is provided for coupling light out of a part of the second surface 32. The second light out-coupling element 93 is arranged on a plane of the first light guide 3 extending parallel to and arranged opposite to the first light input surface 31, i.e. in the embodiment shown on the second surface 32, and opposite the first light out-coupling element 9. Thereby more light may be coupled out of the first light guide 3 by means of the now two light out-coupling elements 9, 93 arranged on different and opposite planes thus likewise providing for a higher intensity and brightness of the light output from the first light guide 3 as well as for coupling light out in two different directions simultaneously.

It is noted that the additional first light sources 23, 24 may in principle be provided at any surface of the first light guide 3, and/or that additional first light sources may also be provided at more than one surface of the first light guide 3 other than the first light input surface 31. Also, in principle any number of additional first light sources may be provided.

Likewise, it is noted that the second light out-coupling element 93 may in principle be provided at any surface of the first light guide 3. Also, the second light out-coupling element 93 may be provided at more than one surface of the first light guide 3 other than the second surface 32. The second light out-coupling element 93 may furthermore be of any of the types described with reference to FIGS. 5A-5G for the first light out-coupling element 9.

Figure 8:
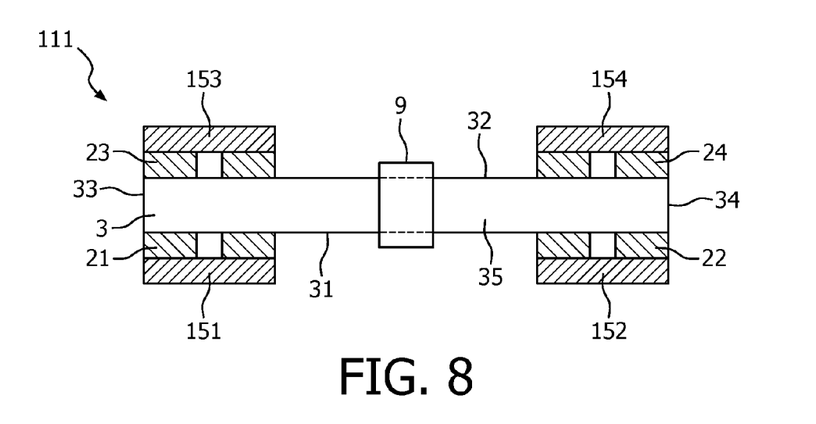
FIG. 8 shows an end view of an embodiment of a light emitting device according to the invention.

Turning now to FIG. 8, an end view of an embodiment of a light emitting device 111 according to the invention is shown.

The light emitting device 111 differs from that shown in FIG. 7 and described above in only one point, namely that as an alternative or addition to providing a second light out-coupling element 93 the first light out-coupling element 9 is provided such as to extend partially or, as shown, completely around the first light guide 3.

In the embodiments according to FIGS. 7 and 8 light may be coupled out of the first light guide 3 from more than one surface or plane, and thus in more than one direction, simultaneously.

Furthermore, in the embodiments according to FIGS. 7 and 8 the end sections of the first light guide 3 extending on each side of the light out-coupling element(s) 9, 93 may also be shaped, e.g. such as to have a trapezoid cross section as seen in an end view corresponding to that of FIGS. 7 and 8.

For all embodiments of a light emitting device according to the invention and described above it is furthermore feasible to provide more than one light guide, e.g. two or three light guides. The thus two or more light guides may be arranged in any desired configuration, non-limiting examples being, when viewing the resulting light emitting device from above, parallel with one another, in the shape of a cross, a plus, a bow, a T or an L.

Figure 9:
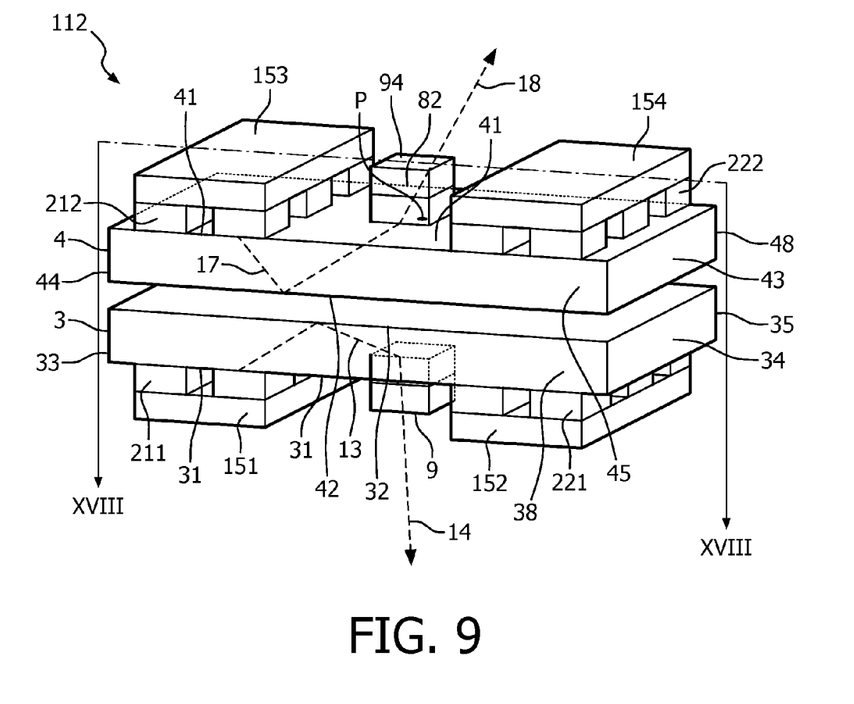
FIG. 9 shows a perspective view of an embodiment of a light emitting device according to the invention.
Figure 10:
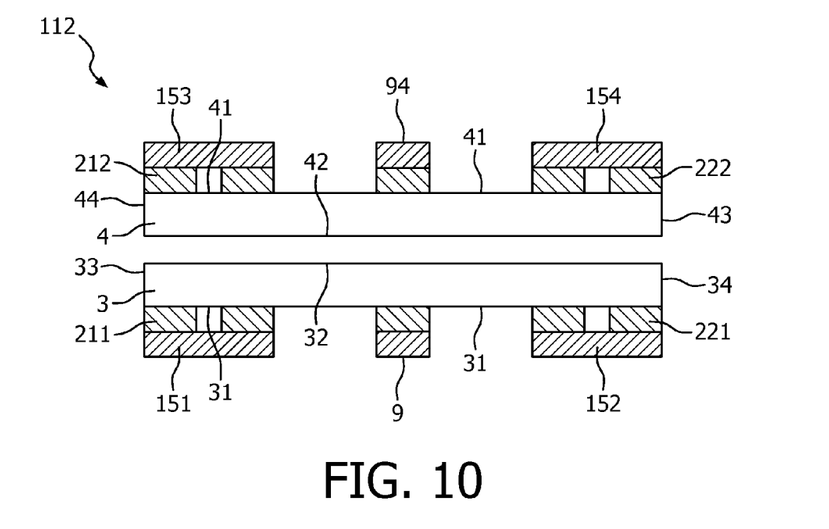
FIG. 10 shows a cross sectional view along the line XVIII-XVIII of the light emitting device according to FIG. 9.

FIG. 9 shows a perspective view of a light emitting device 112 according to an embodiment of the invention. FIG. 10 shows a cross sectional view of the light emitting device 112 along the line XVIII-XVIII of the light emitting device according to FIG. 9.

The light emitting device 112 comprises first light sources 211, 221 arranged on first bases 151, 152, a first light guide 3 and a first light out-coupling element 9 according to any of the embodiments described above.

The light emitting device 112 further comprises a plurality of second light sources 212, 222 arranged on second bases 153, 154, a second light guide 4 and one third light out-coupling element 94. The second light sources, second bases, second light guide and third light out-coupling element are each of a type corresponding to the first light sources, first bases, first light guide and first light out-coupling element according to any of the embodiments described above.

Thus, the light emitting device 112 essentially comprises two identical light emitting devices 1, 101-111 according to any of the embodiments described above in relation to FIGS. 3-8. Alternatively, a light emitting device of the type shown in FIG. 9 may comprise two different light emitting devices 1, 101-111 according to any of the embodiments described above in relation to FIGS. 3-8. Also, light emitting devices comprising three or more light emitting devices 1, 101-111 according to any of the embodiments described above in relation to FIGS. 3-8 are likewise feasible.

The second light guide 4 is shown shaped generally as a square plate having a second light input surface 41. The second light guide 4 further comprises side surfaces 42, 43, 44, 45, 48. The second light guide 4 may also be bar or rod shaped or shaped e.g. as a rectangular plate. The second light sources 212, 222 are arranged adjacent to and in optical contact with the second light input surface 41 of the second light guide 4.

The first light guide 3 and the second light guide 4 are arranged in such a way with respect to each other that the plane of the first light input surface 31 and the plane of the second light input surface 41 face away from each other.

Furthermore, the second light guide 4 may comprise a transparent material, a luminescent material, a garnet, a light concentrating material or a combination thereof, being different from or the same as the material of the first light guide 3. Suitable materials and garnets are described above.

Preferably, however, the second light guide 4 is a transparent light guide comprising a material adapted for converting light with one spectral distribution to light with a second spectral distribution. The material adapted for converting light with one spectral distribution to light with another spectral distribution may be arranged at a surface of the second light guide 4, and is in embodiments embedded in the second light guide 4, and the material may be different from or the same as the material of the first light guide 3.

Thus, the first and third spectral distribution and the second and fourth spectral distribution, respectively, may be identical or different spectral distributions.

As shown in FIG. 9, the third light out-coupling element 94 is arranged on the second light input surface 41 at the center of a plane in which the second light input surface 41 extends. More particularly, the second light input surface 41 comprises a circumferential edge 82, the third light out-coupling element 94 is arranged at a point P on the second light input surface 41 and the point P is located where any one distance perpendicular to the circumferential edge 82 is the largest possible, all distances perpendicular to the circumferential edge 82 being given equal weight.

It is noted, however, that the position of the third light out-coupling element 94 is not limited to the position shown in FIG. 9, but may in principle be any pre-selected position on the plane in which the second light input surface 41 of the second light guide 4 extends. Furthermore, the third light out-coupling element 94 may in principle be any one of the types described above in respect of the first light out-coupling element 9 with reference to FIGS. 5A to 5G, and the third light out-coupling element 94 may be of the same type as or a different type than the first light out-coupling element 9.

Alternatively, it is also feasible that the second light out-coupling element may comprise two or more regions with different optical characteristics.

In a further alternative the first and/or third light out-coupling element 9, 94 may extend partially or completely around one or both of the first light guide 3 and the second light guide 4, and/or the first and third light out-coupling element 9, 94 may be one continuous light out-coupling element.

The light emitting device 112 according to FIGS. 9 and 10 generally works as follows. First light 13 having a first spectral distribution is emitted by each light source of the plurality of first light sources 211, 221. The first light 13 having the first spectral distribution is then coupled into the first light guide 3 at a part of the first light input surface 31. At least a part of the first light 13 with the first spectral distribution is converted by the light guide 3 to second light 14 having a second spectral distribution. Finally, the second light 14 having the second spectral distribution is coupled out of the first light guide 3 the first light out-coupling element 9, and is thus emitted by the light emitting device 112. The area of emission is confined to the size of the first light out-coupling element 9, thereby obtaining a light concentrating effect. Simultaneously, third light 17 having a third spectral distribution is emitted by each light source of the plurality of second light sources 212, 222. The third light 17 having the first spectral distribution is then coupled into the second light guide 4 at a part of the second light input surface 41. At least a part of the third light 17 with the third spectral distribution is converted by the second light guide 4 to fourth light 18 having a fourth spectral distribution. Finally, the fourth light 18 having the fourth spectral distribution is coupled out of the second light guide 4 at the third light out-coupling element 94, and is thus emitted by the light emitting device 112. The area of emission is confined to the size of the third light out-coupling element 94, thereby obtaining a light concentrating effect.

The person skilled in the art realizes that the present invention by no means is limited to the preferred embodiments described above. On the contrary, many modifications and variations are possible within the scope of the appended claims.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising:
  a plurality of first light sources adapted for, in operation, emitting first light with a first spectral distribution, the first light sources being arranged on a base,
  a first light guide comprising a first surface, the first light guide being adapted for receiving the first light with the first spectral distribution at an input region of the first surface, converting at least a part of the first light with the first spectral distribution to second light with a second spectral distribution, and guiding the second light to an exit region of the first surface different from the input region, and
  a first light out-coupling element for coupling light out of the first surface and through a central opening of the base, the first light out-coupling element being arranged in or on the exit region of the first surface,
  wherein the first light out-coupling element is arranged in or on the first surface at a center portion of the first surface.

2. The light emitting device according to claim 1, wherein the first surface comprises a circumferential edge, and wherein the first light out-coupling element is arranged at a location on the first surface, the location being at a position where any one distance perpendicular to the circumferential edge is the largest possible, all distances perpendicular to the circumferential edge being given equal weight.

3. The light emitting device according to claim 1, the first light guide further being adapted for receiving the first light with the first spectral distribution at a second surface extending parallel to and arranged opposite to the first light input surface.

4. The light emitting device according to claim 1, wherein the first light out-coupling element is chosen from the group comprising a roughening of a part of the first light input surface, a diffractive element, a refractive element, a reflective element, a scattering element, a shaped recess provided in the first light input surface, a shaped protrusion provided on the first light input surface, a luminescent element, a pixilated luminescent element, and combinations thereof.

5. The light emitting device according to claim 1, wherein the first light out-coupling element for coupling light out of the first surface comprises at least two regions with different optical characteristics, the at least two regions being arranged adjacent to one another in at least one of a direction parallel to the first surface and a direction substantially perpendicular to the first surface.

6. The light emitting device according to claim 1, further comprising a second light out-coupling element for coupling light out of a second surface, the second light out-coupling element being arranged in or on the second surface of the first light guide opposite the first light out-coupling element, said second surface extending parallel to and being arranged opposite to the first surface.

7. The light emitting device according to claim 1, wherein the area of the first light out-coupling element is more than two times smaller than the area of the first surface, more than ten times smaller than the area of the first surface, or more than one hundred times smaller than the area of the first surface.

8. The light emitting device according to claim 1, further comprising one or more of:
  a first reflective element being arranged at or on at least one of further surfaces of the first light guide,
  a second reflective element arranged at a surface that extends parallel to and is arranged opposite to the first surface, and at least one third reflective element arranged at a part of the first surface.

9. A lamp, a luminaire, or a lighting system comprising the light emitting device according to claim 1, the lamp, luminaire and lighting system being used in one or more of the following applications: digital projection, automotive lighting, stage lighting shop lighting, home lighting, accent lighting, spot lighting, theater lighting, fiber optic lighting, display systems, warning lighting systems, medical lighting applications, decorative lighting applications.

10. A light emitting device comprising:
a plurality of first light sources adapted for, in operation, emitting first light with a first spectral distribution, and
a first light guide comprising a first surface, the first light guide being adapted for receiving the first light with the first spectral distribution at an input region of the first surface, converting at least a part of the first light with the first spectral distribution to second light with a second spectral distribution, and guiding the second light to an exit region of the first surface different from the input region, and
a first light out-coupling element for coupling light out of the first surface, the first light out-coupling element being arranged in or on the exit region of the first surface,
wherein the first light out-coupling element is arranged in or on the first surface at a center portion of the first surface, the light emitting device, further comprising:
a plurality of second light sources adapted for, in operation, emitting third light with a third spectral distribution, and
a second light guide comprising a second surface, the second light guide being adapted for receiving the third light with the third spectral distribution at an input region of the second surface, converting at least a part of the third light with the third spectral distribution to fourth light with a fourth spectral distribution, and guiding the fourth light to an exit region of the second surface, and
a third light out-coupling element for coupling light out of the second surface, the third light out-coupling element being arranged in or on the exit region of the second surface.

11. The light emitting device according to claim 10, wherein the third light out-coupling element is arranged in or on the second surface at a center portion of the second surface.

12. The light emitting device according to claim 10, wherein the second surface comprises a circumferential edge, and wherein the third light out-coupling element is arranged at a point on the second surface, said point being located where any one distance perpendicular to the circumferential edge is the largest possible, all distances perpendicular to the circumferential edge being given equal weight.

13. The light emitting device according to claim 10, wherein the first light guide is arranged in such a way with respect to each other that the plane of the first surface and the plane of the second surface face away from each other.

14. The light emitting device according to claim 10, wherein the first light out-coupling element and the third light out-coupling element are provided as one common light out-coupling element extending at least partially around the first and second light guide.

* * * * *